US010622950B2

(12) United States Patent
Steiner et al.

(10) Patent No.: US 10,622,950 B2
(45) Date of Patent: Apr. 14, 2020

(54) AMPLIFIER ARRANGEMENT AND SWITCHED CAPACITOR INTEGRATOR

(71) Applicant: ams AG, Unterpremstaetten (AT)

(72) Inventors: Matthias Steiner, Seiersberg (AT); Andreas Fitzi, Staefa (CH)

(73) Assignee: ams AG, Unterpremstaetten (AT)

( * ) Notice: Subject to any disclaimer, the term of this patent is extended or adjusted under 35 U.S.C. 154(b) by 0 days.

(21) Appl. No.: 15/780,601

(22) PCT Filed: Nov. 8, 2016

(86) PCT No.: PCT/EP2016/076999
§ 371 (c)(1),
(2) Date: May 31, 2018

(87) PCT Pub. No.: WO2017/092980
PCT Pub. Date: Jun. 8, 2017

(65) Prior Publication Data
US 2019/0006998 A1 Jan. 3, 2019

(30) Foreign Application Priority Data
Dec. 4, 2015 (EP) .................................... 15198050

(51) Int. Cl.
*H03F 3/45* (2006.01)
*H03F 1/26* (2006.01)
(Continued)

(52) U.S. Cl.
CPC .............. *H03F 1/26* (2013.01); *H03F 3/005* (2013.01); *H03F 3/423* (2013.01); *H03F 3/4521* (2013.01);
(Continued)

(58) Field of Classification Search
CPC ...... H03F 1/26; H03F 3/45645; H03F 3/4521; H03F 3/423; H03F 3/005;
(Continued)

(56) References Cited

U.S. PATENT DOCUMENTS 7,348,810 B1\* 3/2008 Nair ...................... H03F 1/0261
326/83
9,419,564 B2\* 8/2016 Tajalli .................. H03F 1/0205
(Continued)

FOREIGN PATENT DOCUMENTS

EP      2879292 A1    6/2015
WO    2012101457 A1    8/2012
(Continued)

OTHER PUBLICATIONS

Sepehrian, H. et al.: "A Low-Power Current-Reuse Analog Front-End for Multi-Channel Neural Signal Recording" IEEE, Jun. 22, 2014, pp. 440-443, XP032668075.
(Continued)

*Primary Examiner* — Khanh V Nguyen
(74) *Attorney, Agent, or Firm* — Fish & Richardson P.C.

(57) ABSTRACT

An amplifier arrangement has a first differential stage with a first transistor pair, a second differential stage with a first and a second transistor pair, each pair having a common source connection. The amplifier arrangement further has a first complementary differential stage with a transistor pair having opposite conductivity type, and a second complementary differential stage with a first and a second transistor pair of the complementary conductivity type. The first and the second complementary differential stage are connected symmetrically compared to the first and the second differential stage. The transistors of the second differential stage and the second complementary differential stage are symmetrically connected to form respective first, second, third
(Continued)

and fourth current paths. A pair of output terminals is coupled to the first and the fourth current path. Gate terminals of the transistors are coupled to a respective pair of input terminals.

14 Claims, 3 Drawing Sheets

(51) Int. Cl.
  *H03F 3/00* (2006.01)
  *H03F 3/42* (2006.01)
(52) U.S. Cl.
  CPC ... *H03F 3/45645* (2013.01); *H03F 2200/129* (2013.01); *H03F 2200/264* (2013.01); *H03F 2200/372* (2013.01); *H03F 2200/555* (2013.01); *H03F 2200/75* (2013.01); *H03F 2203/45012* (2013.01); *H03F 2203/45082* (2013.01); *H03F 2203/45088* (2013.01); *H03F 2203/45091* (2013.01); *H03F 2203/45116* (2013.01); *H03F 2203/45134* (2013.01); *H03F 2203/45156* (2013.01); *H03F 2203/45171* (2013.01); *H03F 2203/45174* (2013.01); *H03F 2203/45176* (2013.01); *H03F 2203/45208* (2013.01); *H03F 2203/45221* (2013.01); *H03F 2203/45244* (2013.01); *H03F 2203/45352* (2013.01); *H03F 2203/45416* (2013.01); *H03F 2203/45434* (2013.01); *H03F 2203/45461* (2013.01); *H03F 2203/45481* (2013.01); *H03F 2203/45512* (2013.01); *H03F 2203/45544* (2013.01); *H03F 2203/45551* (2013.01); *H03F 2203/45561* (2013.01); *H03F 2203/45616* (2013.01)
(58) Field of Classification Search
  CPC . H03F 2203/45012; H03F 2203/45461; H03F 2203/45176; H03F 2203/45616; H03F 2203/45551; H03F 2203/45544; H03F 2203/45512; H03F 2203/45481; H03F 2203/45434; H03F 2203/45416; H03F 2203/45352; H03F 2203/45244; H03F 2203/45221; H03F 2203/45208; H03F 2203/45174; H03F 2203/45171; H03F 2203/45156; H03F 2203/45134; H03F 2203/45116; H03F 2203/45091; H03F 2203/45088; H03F 2203/45082; H03F 2200/75; H03F 2200/555; H03F 2200/372; H03F 2200/264; H03F 2200/129; H03F 2203/45561
  USPC .......................................... 330/253, 262–264
  See application file for complete search history.

(56) References Cited

U.S. PATENT DOCUMENTS 9,813,026 B2 * 11/2017 Fitzi .................. H03F 1/26
2009/0184767 A1    7/2009 Hayashi et al.

FOREIGN PATENT DOCUMENTS

| WO | 2012101467 A  | 8/2012 |
|----|---------------|--------|
| WO | 2015078611 A1 | 6/2015 |

OTHER PUBLICATIONS

Seung-Tak Ryu et al.: "A 10-bit 50-MS/S pipelined ADC with opamp current reuse" IEEE vol. 42, No. 3; Mar. 1, 2007; pp. 475-485; XP011171999, ISSN: 0018-9200.

Quinn: IEEE: "High-Accuracy Charge-Redistribution SC Video Bandpass Filter in Standard 0.8 μm CMOS" IEEE Journal of Solid-State Circuits 33. 963-975. 10.1109/4.701233 Aug. 1998.

Johnson, Ben at al.: "Orthogonal Current-Reuse Amplifier for Multi-Channel sensing" IEEE vol. 48, No. 6; Jun. 1, 2013; pp. 1487-1496; ISSN: 0018-9200.

* cited by examiner

AMPLIFIER ARRANGEMENT AND SWITCHED CAPACITOR INTEGRATOR

BACKGROUND OF THE INVENTION

The present disclosure relates to an amplifier arrangement and to a switched capacitor integrator with such an amplifier arrangement.

Amplifiers are widely used in sampling circuits for transferring charge into sampling capacitors. To ensure an accurate transfer of charge in a limited amount of time, such an amplifier requires a certain minimum transconductance gm. For such applications, the amplifier is usually the dominant source of noise.

Conventional amplifier concepts can provide a sufficient transconductance only with a high current consumption or provide a limited transconductance when reducing the current consumption. Furthermore, such conventional amplifier concepts have a limited noise performance.

SUMMARY OF THE INVENTION

The present disclosure provides an improved amplifier concept which provides an efficient trade-off between current consumption and speed, respectively transconductance, while having a low noise contribution.

The improved amplifier concept is based on the idea to reuse the same supply current in multiple differential transistor input pairs of the amplifier. Additionally, multiple stages, in particular at least four stages with one or more transistor pairs, are formed in the amplifier, thereby forming a symmetric structure with complementary transistor types. Each stage of the amplifier provides a distinct pair of input terminals, whereas a single pair of output terminals is sufficient. The at least four pairs of input terminals allow to provide distinct common mode voltages to each of the input pairs, which is particularly useful when using such an amplifier in a switched capacitor integrator having a respective pair of sampling capacitors for each pair of input terminals. The improved amplifier concept allows to achieve a lower noise contribution for a given transconductance gm.

According to an example embodiment, an amplifier arrangement according to the improved amplifier concept comprises a first, a second, a third and a fourth pair of input terminals and a pair of output terminals. The amplifier arrangement has a first differential stage comprising a first and a second transistor, and a second differential stage comprising a first, a second, a third and a fourth transistor. Said first and second transistor of the second differential stage have a common source connection coupled to a drain terminal of the first transistor of the first differential stage, and said third and fourth transistor of the second differential stage have a common source connection coupled to a drain terminal of the second transistor of the first differential stage.

The amplifier arrangement further has a first complementary differential stage comprising a first and a second complementary transistor having opposite conductivity type compared to the transistors of the first differential stage. The amplifier arrangement further has a second complementary differential stage comprising a first, a second, a third and a fourth complementary transistor having opposite conductivity type compared to the transistors of the second differential stage. Said first and second transistor of the second complementary differential stage have a common source connection coupled to a drain terminal of the first transistor of the first complementary differential stage. Similarly, said third and fourth transistor of the second complementary differential stage have a common source connection coupled to a drain terminal of the second transistor of the first complementary differential stage.

In the amplifier arrangement the complementary transistors of the second complementary differential stage are symmetrically connected to the transistors of the second differential stage such that respective first, second, third and fourth current paths are formed. The pair of output terminals is coupled to the first and the fourth current path. Gate terminals of the transistors of the first differential stage are coupled to the first pair of input terminals. Gate terminals of the transistors of the second differential stage are coupled to the second pair of input terminals. Gate terminals of the transistors of the first complementary differential stage are coupled to the third pair of input terminals, and gate terminals of the transistors of the second complementary differential stage are coupled to the fourth pair of input terminals.

In various implementations, while the first and the fourth current path are coupled to the pair of output terminals, the second and the third current path are connected together with a single common connection. For example, the amplifier arrangement further comprises a biasing voltage source that is coupled to said common connection of the and the third current path. Hence, during operation of the amplifier arrangement, noise contributions in the various current paths distribute such that only some of the noise contributions appear at the output terminals while others, in particular at the second and the third current path, are removed from the output and provided to the biasing voltage source. In other words, parts of the noise contribution are dumped to the biasing voltage source.

In some example implementations the amplifier arrangement further comprises a first tail source and a second tail source. A common source connection of the first and the second transistor of the first differential stage is coupled to the first tail source. A common source connection of the first and the second transistor of the first complementary differential stage is coupled to the second tail source. At least one of the first and the second tail source can be implemented with a fixed current source or a controlled current source or with a connection to a supply terminal. For example, the single stage class AB behavior can be achieved if the tail sources are connected to the respective supply terminals directly. In this case, stability of the arrangement is easy to achieve in the design of the amplifier arrangement. Additionally, an efficient settling of the arrangement can be achieved.

In various implementations of the amplifier arrangement the transistors of the first differential stage and the transistors of the second differential stage have the same threshold voltage. Similarly, the transistors of the first complementary differential stage and the transistors of the second complementary differential stage have the same threshold voltage. Hence, all transistors, at least of one conductivity type, can be manufactured with the same configuration of the gate oxide, which reduces or at least does not increase production effort. Furthermore, the amplifier arrangement becomes compatible with low supply voltages due to the single threshold of all transistors. The common threshold voltages additionally effect that there is no amplifier output voltage range restriction.

In the example embodiments described above, the basic implementation with two differential stages of each conductivity is described. However, additional differential stages can be inserted into the structure, further reducing the noise contribution while maintaining the same transconductance gm.

For example, in some example implementations, the amplifier arrangement further comprises a third differential stage comprising a first, a second, a third and a fourth transistor. The third differential stage is coupled between the first and the second differential stage such that said first and second transistor of the third differential stage have a common source connection coupled to a drain terminal of the first transistor of the first differential stage. Said third and fourth transistor of the third differential stage have a common source connection coupled to a drain terminal of the second transistor of the first differential stage. In a similar fashion the amplifier arrangement comprises a third complementary differential stage comprising a first, a second, a third and a fourth transistor having opposite conductivity type compared to the transistors of the third differential stage. The third complementary differential stage is coupled between the first complementary and the second complementary differential stage such that said first and second transistor have a common source connection coupled to a drain terminal of the first transistor of the first complementary differential stage. The third and fourth transistor of the third complementary differential stage have a common source connection coupled to a drain terminal of the second transistor of the first complementary differential stage.

Gate terminals of the transistors of the third differential stage are coupled to a fifth pair of input terminals, and gate terminals of the transistors of the third complementary differential stage are coupled to a sixth pair of input terminals.

Preferably, one of the first and the second transistors of the third differential stage has its drain terminal connected to the common source connection of the first and the second transistor of the second differential stage, while the other one has its drain connection at the second and the third current path. A symmetric configuration is applied to the third and the fourth transistor of the third differential stage with respect to the third and the fourth transistor of the differential stage and said common connection. Additionally, the same connection scheme is applied to the transistors of the third complementary differential stage with the appropriate adaptations. Such an implementation can further decrease the current consumption of the amplifier arrangement.

In a further development of the improved amplifier concept, a fourth differential stage and a fourth complementary differential stage, each comprising a first, a second, a third and a fourth transistor, are provided in the amplifier arrangement. The fourth differential stage is coupled between the first and the third differential stage such that the first and the second transistor of the fourth differential stage have a common source connection coupled to a drain terminal of the first transistor of the first differential stage, and the third and fourth transistor of the fourth differential stage have a common source connection coupled to a drain terminal of the second transistor of the first differential stage.

In a similar fashion the first, the second, the third and the fourth transistor of the fourth complementary differential stage, which have an opposite conductivity type compared to the transistors of the fourth differential stage are connected. In particular, the fourth complementary differential stage is coupled between the first complementary and the third complementary differential stage such that the first and the second transistor of the fourth complementary differential stage have a common source connection coupled to a drain terminal of the first transistor of the first complementary differential stage. The third and fourth transistor of the fourth complementary differential stage have a common source connection coupled to a drain terminal of the second transistor of the first complementary differential stage.

Gate terminals of the transistors of the fourth differential stage are coupled to a seventh pair of input terminals, and gate terminals of the transistors of the fourth complementary differential stage are coupled to an eighth pair of input terminals.

Similarly, as described for the connection scheme for the transistors of the third differential stage and the third complementary differential stage, a respective one of the two transistor pairs of such a stage is connected to a common source connection of a transistor pair of the third differential, respectively third complementary differential stage, while the other one is connected to the common connection of the second and the third current path. A detailed enumeration of the connections is omitted here for the sake of brevity. However, this will easily be apparent for the skilled reader from the above description.

Theoretically, further differential stages can be inserted according to the same scheme. Preferably all of the complementary differential stages have transistors of the same conductivity type, which is complementary to all of the transistors of the "non-complementary" differential stages.

The amplifier arrangement can have a common pair of input terminals for providing e.g. a single differential input signal. In such a configuration, the amplifier arrangement can have respective level shifters that couple the pair of common input terminals to the at least four pairs of input terminals. In particular, a respective common mode voltage, that preferably is adapted to the position of the input terminal, can be applied to the respective pairs of input terminals. A detailed implementation of the level shifters depends on the application or processing of a single differential input signal with the amplifier arrangement, which becomes apparent to the skilled reader.

The embodiments of the amplifier arrangement described above can be used within a switched capacitor integrator, for example.

In some example implementations, such a switched capacitor integrator comprises an amplifier arrangement according to one of the implementations described above and further comprises a first, a second, a third and a fourth of sample capacitors that are coupled to a pair of common input terminals by at least one pair of first switching elements, and are coupled to the first, the second, the third and the fourth pair of input terminals, respectively, by respective pairs of second switching elements. The integrator further comprises a first, a second, a third and a fourth pair of feedback capacitors that are coupled between the pair of output terminals and the first, the second, the third and the fourth pair of input terminals, respectively. A first, a second, a third and a fourth common mode input is provided for applying respective common mode voltages, said common mode inputs being coupled to the first, the second, the third and the fourth pair of sampling capacitors, respectively, by further respective pairs of first switching elements. The integrator further comprises at least one further second switching element for connecting the sampling capacitors together. For example, said at least one further second switching element connects those terminals of the sampling capacitors that are connectable to the pair of common input terminals by the at least one pair of first switching elements.

Hence, compared to a conventional switched capacitor integrator, a single pair of sampling capacitors is distributed or divided into at least four pairs of sampling capacitors, one pair for each pair of input terminals. In a similar fashion, a single pair of feedback capacitors of a conventional integrator is distributed or divided into at least four pairs of feedback capacitors, one for each pair of input terminals. In this example implementation only four pairs of input terminals are used. However, if third or even fourth differential stages are implemented, as described above, the number of pairs of sampling capacitors and feedback capacitors increases accordingly. In the same fashion, also the number of common mode inputs for applying respective common mode voltages increases with the increasing number input terminal pairs.

As to the distinction between first switching elements and second switching elements, it should be noted that in various implementations all of the first switching elements are controlled by a switching signal and all of the second switching elements are controlled by a second switching signal. Preferably, the first and the second switching signal are non-overlapping, in particular with respect to a closed condition respectively conducting condition of the switches.

According to some implementations, the integrator further comprises at least one common mode voltage source connected to one of the first, the second, the third and the fourth common mode inputs. Preferably, one distinct common mode voltage source is provided for each one of the common mode inputs.

For example, such a common mode voltage source comprises a series connection of a current source and a diode-connected transistor that is coupled to a supply terminal. An output of the common mode voltage source is formed by a connection point between said current source and said diode-connected transistor. Each common mode voltage source may be scaled to achieve a desired operating point in the amplifier arrangement.

In some implementations, the respective common mode voltage sources are adjustable according to a deviation of an actual integrator output common mode voltage from a desired integrator output common mode voltage. To this end, for example an output common voltage regulation loop may be provided, which slightly adjusts the resulting common mode voltages depending on the integrator output common mode voltage error.

In some configurations the output of amplifier arrangement respectively the switched capacitor integrator can be connected to an input of a sigma-delta (IA) analog-to-digital converter for processing the integrated output signal of the amplifier and providing a bit stream thereof.

BRIEF DESCRIPTION OF THE DRAWINGS

Several example embodiments according to the improved concept are described in greater detail below with reference to the drawings. In the drawings, elements with identical function or meaning are identified by the same reference symbols. Hence, such elements may not be described repeatedly.

In the figures.

DETAILED DESCRIPTION

Figure 1:
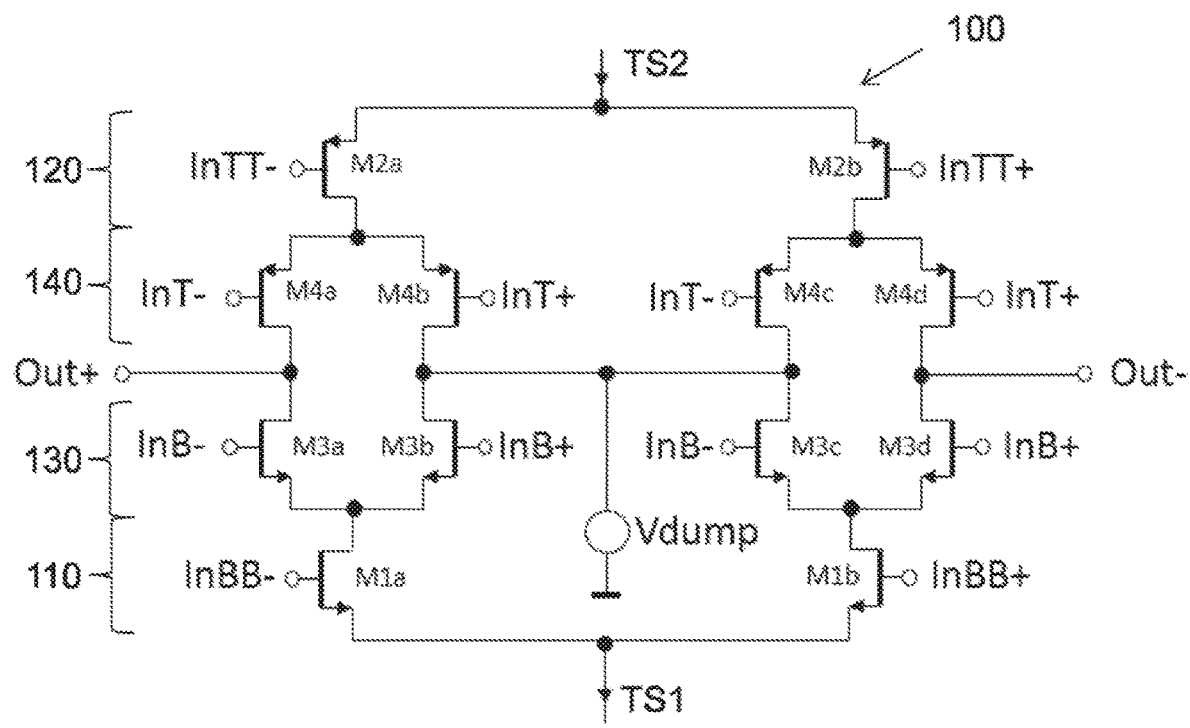
FIG. 1 shows an example embodiment of an amplifier arrangement with multiple differential stages.

FIG. 1 shows an example embodiment of an amplifier arrangement 100 according to the improved amplifier concept. The amplifier arrangement 100 is formed with a first differential stage 110, a second differential stage 130, a first complementary differential stage 120 and a second complementary differential stage 140.

The first differential stage 110 has a first transistor M1a and a second transistor M1b having their gate terminals connected to a first pair of input terminals InBB+, InBB− and having their source terminals commonly connected to a first tail source TS1.

In a symmetric manner, the first complementary differential stage 120 is formed of a first and a second transistor M2a, M2b, which are of the complementary conductivity type compared to the transistors M1a, M1b of the first differential stage. The transistors M2a, M2b have their gate terminals connected to a further pair of input terminals InTT+, InTT− and have their source terminals commonly connected to a second tail source TS2.

The common connection to the tail sources TS1, TS2 is defined such that a current provided from or to the respective tail source is divided to flow to the source terminals of the correspondingly connected transistors. In various implementations, the tail sources TS1, TS2 can be implemented with current sources like fixed current sources or controlled current sources, or by simple connections to respective supply terminals, in particular direct electrical connections to the supply terminals.

The second differential stage 130 comprises two transistor pairs M3a, M3b and M3c, M3d having the same conductivity type as the transistors M1a, M1b of the first differential stage 110. The source terminals of the transistors M3a, M3b of the first pair are commonly connected to the drain terminal of transistor M1a of the first differential stage 110. The respective gate terminals of these transistors M3a, M3b are connected to a further pair of input terminals InB+, InB−. In a similar fashion, the transistors M3c, M3d of the second pair have their source terminals commonly connected to the drain terminal of the transistor M1b and their gate terminals connected to the same pair of input terminals InB+, InB− as transistors M3a, M3b.

Again, in a symmetrical fashion, the second complementary differential stage 140 is formed from two transistor pairs M4a, M4b and M4c, M4d, which have their source terminals commonly connected to the drain terminal of transistor M2a for transistors M4a, M4b and to the drain terminal of transistor M2b for transistors M4c, M4d. The gate terminals of the transistors M4a, M4b, M4c, M4d of the second complementary differential stage 140 are connected to a further pair of input terminals InT+, InT−. The drain terminals of the transistors of the second differential stage 130 and the transistors of the second complementary differential stage 140 are each connected in a one-to-one connection, such that the drain terminals of transistors M3a and M4a are connected, the drain terminals of transistors M3b and M4b are connected etc. Additionally, the connection point between transistors M3a and M4a and the connection point between transistors M3d and M4d together form a pair of output terminals Out+, Out−. Moreover, the connection points of transistors M3b, M4b and M3c, M4c are connected together, defining a common potential. Additionally, in this example embodiment, said common connection is connected to a biasing voltage source Vdump.

With the described connection of the second differential stage and the second complementary differential stage, respective first, second, third and fourth current paths are formed due to the symmetrical connection. In this example embodiment, the pair of output terminals Out+, Out− is connected to the first and the fourth current path, whereas the second and the third current path are interconnected with the biasing voltage source Vdump.

The amplifier arrangement 100 of FIG. 1 provides two pairs of input terminals of each conductivity type of the transistors used. This allows a more individual usage of the input terminals. For example, if a single differential input signal is to be processed with the amplifier arrangement 100, it can be employed for all four pairs of input terminals, wherein for each pair of input terminals a specific common mode voltage will be applied.

Figure 2:
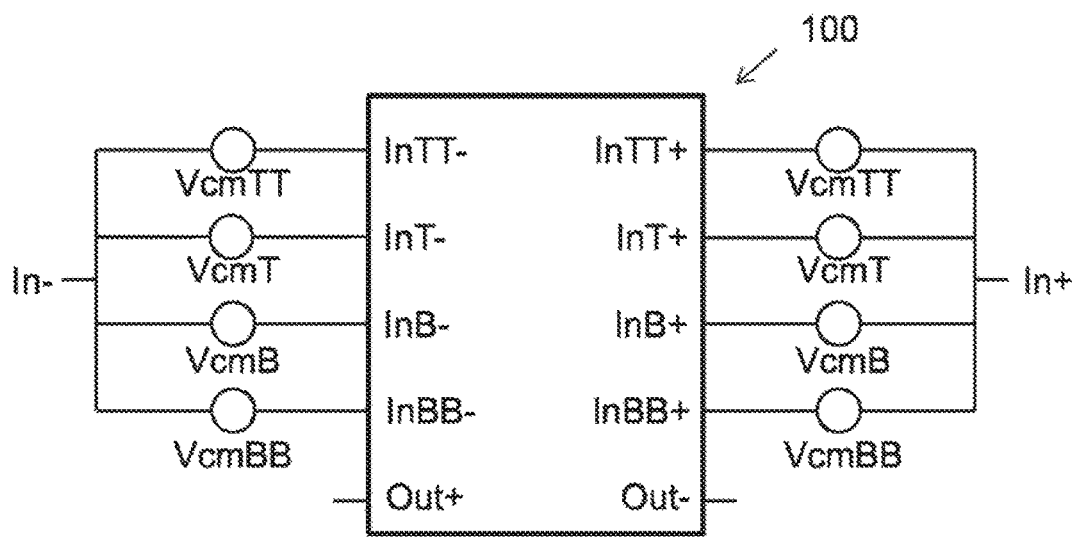
FIG. 2 shows an example implementation of an amplifier arrangement according to FIG. 1 with a common input pair.

FIG. 2 shows an example implementation of the amplifier arrangement 100 of FIG. 1 employing the proposed scheme. In particular, four individual common mode voltage sources VcmTT, VcmT, VcmB, VcmBB are connected between a common pair of input terminals In+, In− and the four pairs of input terminals, respectively.

Such an implementation brings an improvement in the noise performance, compared to conventional solutions. For example, assuming that the differential input voltage is the same for all pairs of input terminals, InTT, InT, InB, InBB, the noise and gm performance of the amplifier arrangement 100 can be presented as follows:

$$gm = \frac{gmM1}{2} + \frac{gmM2}{2} + gmM3 + gmM4,$$

with gmMx being the transconductance of transistors Mx (x=1, 2, 3, 4).

Assuming this results to:

$$gmM3 = \frac{gmM1}{2} \text{ and } gmM4 = \frac{gmM2}{2},$$

The input referred thermal noise voltage density $sn^2$ can be calculated as:

$$sn^2 = \frac{8}{3} * \frac{kT}{gm}$$

As can be seen in the above example, the gm performance is the same as for a conventional telescopic operational transconductance amplifier, OTA, leading to the same current consumption for a given transconductance gm. However, the noise is 3 dB lower, which stems from the fact that half (−6 dB) of the noise current of transistors M1a, M1b respectively M2a, M2b is removed from the output OUT due to the stacked differential transistor pairs of the second differential stage 130 respectively the second complimentary differential stage 140, and dumped to the biasing voltage source Vdump instead. The second differential stage 130 respectively the second complimentary differential stage 140 only add uncorrelated noise to the output OUT, which is also uncorrelated between the positive and negative output, and therefore contributes the same amount as the first differential stages 110, 120.

In the above-described example embodiment, the transistors of the lower half, "normal" differential stages 110, 130 may be implemented with transistors that all have the same threshold voltage and therefore can be produced with the same process steps. Accordingly, also the transistors of the complementary stages 120, 140 can be implemented with the same threshold voltage, employing the same advantages. Hence, the amplifier arrangement can be produced with a satisfying cost efficiency.

By selecting the input common mode voltage for the input pair InB+, InB− higher than the common mode voltage for the input pair InBB+, InBB−, the transistors of the first differential stage 110 can be kept in their saturation region even if the transistors of the first and the second differential stage have the same threshold voltage. The same applies to the common mode voltages at the input pairs InT+, InT− and InTT+, InTT− with the transistors of the complementary differential stages 120, 140.

Figure 3:
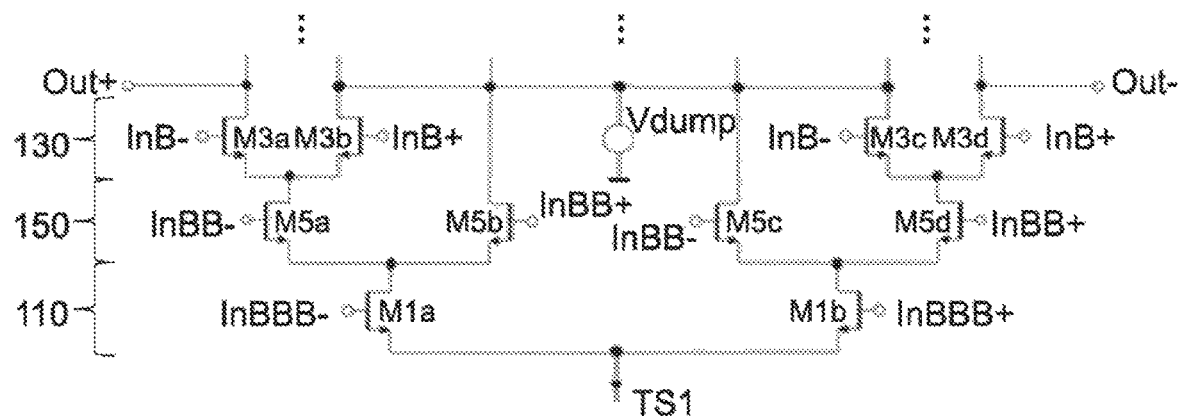
FIG. 3 shows a detail of an example implementation of an amplifier arrangement with a third differential stage.

FIG. 3 shows a detail of a development of the amplifier arrangement of FIG. 1, where additional differential stages are inserted. In particular, a third differential stage 150 is inserted between the first and the second differential stages 110, 130. The third differential stage 150 comprises a first, a second, a third and a fourth transistor M5a, M5b, M5c, M5d that are grouped in two differential pairs. The gate terminals of said transistors M5a, M5b, M5c, M5d are connected to the pair of input terminals InBB+, InBB−. Slightly deviating from the arrangement of FIG. 1, the transistors M1a, M1b of the first differential stage 110 are connected to a further pair of input terminals InBBB+, InBBB−.

The transistor pair M5a, M5b has its source terminals commonly connected to the drain terminal of transistor M1a, while, correspondingly, transistors M5c, M5d have their source terminals commonly connected to the drain terminal of transistor M1b. Transistor M5a has its drain terminal connected to the common source connection of transistors M3a, M3b and, correspondingly, transistor M5d has its drain terminal connected to the common connection of the source terminals of transistors M3c, M3d. The drain terminals of transistors M5b and M5c are connected to the common connection between the second and the third current path, together with the biasing voltage source Vdump.

As mentioned above, FIG. 3 only shows a detail of the development of the amplifier arrangement. However, as indicated by the points of ellipsis in FIG. 3, the same development is also performed with a third complementary differential stage between the first and the second complementary differential stage in a symmetric fashion. The details are omitted only for the purpose of a better overview.

As in the final amplifier arrangement with three differential stages in each half, six pairs of input embodiments exist, also two additional common mode voltages should be provided at the respective input terminal pairs, which would be named VcmBBB and VcmTTT, accordingly.

Looking at the transconductance of the structure as indicated by FIG. 3, it follows that:

$$gm = \frac{gmM1}{4} + \frac{gmM2}{4} + \frac{gmM5}{2} + \frac{gmM6}{2} + gmM3 + gmM4,$$

with gmMx being the transconductance of transistors Mx (x=1, 2, 3, 4, 5, 6).

Assuming $$gmM3 = \frac{gmM1}{4}, gmM4 = \frac{gmM2}{4}, gmM5 = \frac{gmM1}{2}, \text{ and } gmM6 = \frac{gmM2}{2},$$

this results to:

$$gm = \frac{3}{4}(gmM1 + gmM2)$$

The input referred thermal noise voltage density $sn^2$ can be calculated as:

$$sn^2 = \frac{16}{9} * \frac{kT}{gm} = \frac{64}{27} * \frac{kT}{gmM1 + gmM2}$$

As can be seen, the input referred noise density improves by 0.5 dB (=64/27/(8/3)), but the transconductance gm reduces to ¾ compared to FIG. 1 at the same current (same gmM1+gmM2). To bring the input noise back up to the same level of FIG. 1, the current can be decreased to ⅝ (=64/27/(8/3)). In this case, the transconductance gm becomes ⅔ (=¾*⅝) of FIG. 1.

Figure 4:
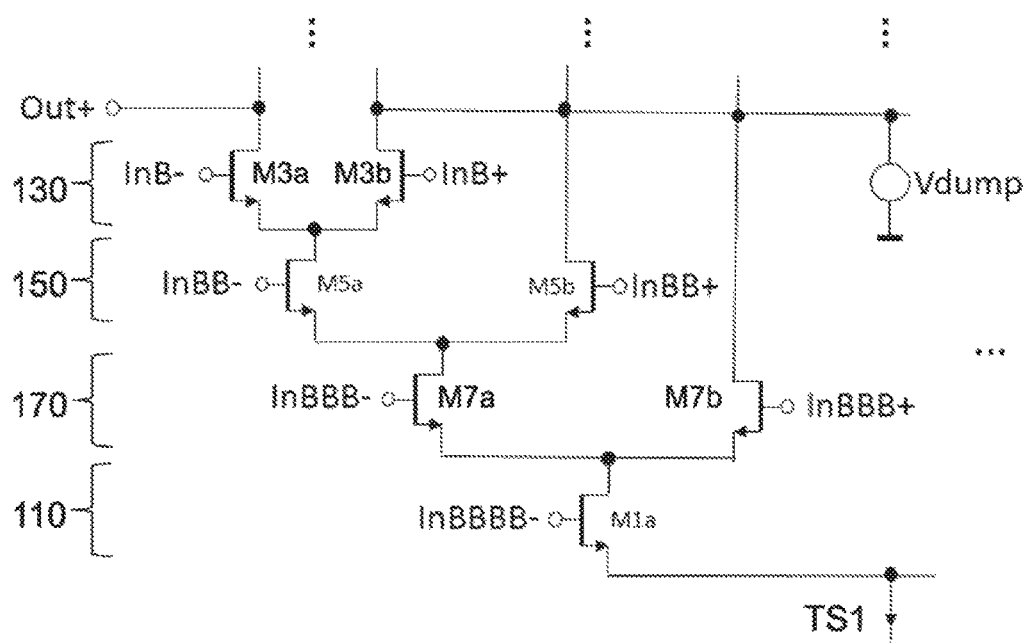
FIG. 4 shows an example implementation of an amplifier arrangement with a fourth differential stage.

FIG. 4 shows a further development of the amplifier arrangement 100, starting from the implementation shown in FIG. 3. In particular, a further differential stage and, not shown, a further complementary differential stage are inserted in between the existing stages. For the purpose of a better overview, only the left half of the "normal" differential stages is shown. However, the remaining portions, having a symmetric structure, become easily apparent for the skilled person from the following description.

The fourth differential stage 170 comprises two further pairs of transistors, from which only the first pair M7a, M7b is shown. Similar to the insertion of the third differential stage, the transistor pair M7a, M7b has their source terminals commonly connected to the drain terminal of the first transistor of the first stage M1a, while the drain terminal of transistor M7a is connected to the common connection of the source terminals of the transistor pair M5a, M5b, and the drain terminal of transistor M7b is connected to the common connection point of the second and the third current path.

According to this insertion, the gate terminals of the transistors M7a, M7b and also the gate terminals of the not shown second transistor pair are connected to the input terminal pair InBBB+, InBBB−, whereas the gate terminals of the transistor pair M1a, M1b are connected to a further input terminal pair InBBBB− and InBBBB+ (not shown). The overall structure of the amplifier arrangement resulting from the detail of FIG. 4 therefore has eight pairs of input terminals, which for operation of the amplifier arrangement preferably are used with eight distinct common mode voltages, as described before. The transconductance performance of such an arrangement can be calculated as follows:

$$gm = \frac{gmM1}{8} + \frac{gmM2}{8} + \frac{gmM7}{4} +$$
$$\frac{gmM8}{4} + \frac{gmM5}{2} + \frac{gmM6}{2} + gmM3 + gmM4,$$

with gmMx being the transconductance of transistors Mx (x=1, 2, 3, 4, 5, 6, 7, 8).

Assuming $$gmM3 = \frac{gmM1}{8}, gmM4 = \frac{gmM2}{8}, gmM5 = \frac{gmM1}{4},$$
$$gmM6 = \frac{gmM2}{4}, gmM7 = \frac{gmM1}{2}, \text{ and } gmM8 = \frac{gmM2}{2},$$

this results to:

$$gm = \frac{1}{2} * (gmM1 + gmM2)$$

The input referred thermal noise voltage density $sn^2$ can be calculated as:

$$sn^2 = \frac{4}{3} * \frac{kT}{gm} = \frac{8}{3} * \frac{kT}{gmM1 + gmM2}$$

As can be seen, the input referred noise stays the same, but the gm reduces to ½ compared to FIG. 1 at the same current (same gmM1+gmM2).

Figure 5:
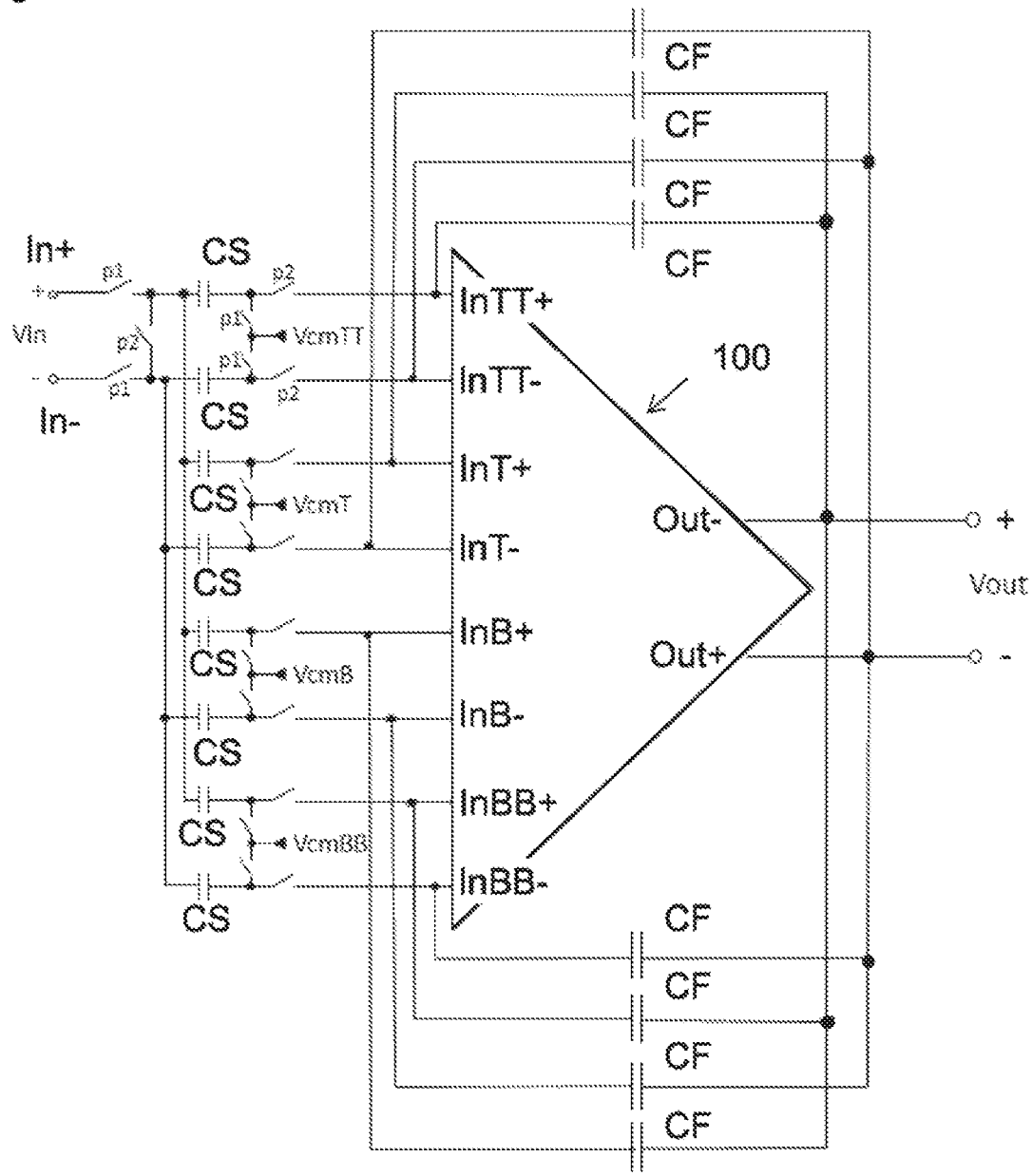
FIG. 5 shows an example implementation of a switched capacitor integrator.

FIG. 5 shows an implementation of an amplifier arrangement 100 according to the improved concept, for example as described in conjunction with FIG. 1. In particular, FIG. 5 shows an example embodiment of a switched capacitor integrator with an amplifier arrangement 100. In this example embodiment, the amplifier arrangement 100 has four pairs of input terminals and a pair of output terminals Out+, Out− forming the output of the switched capacitor integrator for providing an output voltage Vout. The inverting output terminal Out− is connected by a respective feedback capacitor CF to each of the respective positive, non-inverting terminals of the four input terminal pairs. Accordingly, the non-inverting output terminal Out+ is connected to each of the respective inverting terminals of the four input terminal pairs. Preferably the resulting eight feedback capacitors CF have the same capacitance value. However, other capacitance values, in particular different capacitor values could be used by the skilled person.

A common pair of input terminals In+, In− is connected to a first, a second, a third and a fourth pair of sampling capacitors CS by a pair of first switching elements p1, such that a differential input voltage Vin can be switchably provided to a respective first terminal of the sampling capacitors CS. Each pair of sampling capacitors CS is associated to one of the four pairs of input terminals of the amplifier arrangement 100. Accordingly, second terminals of the sampling capacitors CS are coupled to the first, the second, the third and the fourth pair of input terminals, respectively, by respective pairs of second switching elements p2. Said second terminals of the sampling capacitors CS are each connected to a respective common mode voltage source by further respective pairs of first switching elements p1, wherein for each pair of input terminals a dedicated common mode voltage source is provided.

Hence, referring for example to FIG. 2, the input terminal pair InTT+, InTT− is associated with the common mode voltage source VcmTT, the input terminal pair InT+, InT− is associated with the common mode voltage source VcmT, the input terminal pair InB+, InB− is associated with the common mode voltage VcmB and the input terminal pair InBB+, InBB− is associated with the common mode voltage source VcmBB.

A further second switching element p2 is provided between the first terminals of the sampling capacitors, such that a respective potential at all of the sampling capacitors CS can be brought to the same level by closing said second switching element p2.

For operation of the switched capacitor integrator, all of the first switching elements p1 can be controlled by a common first switching signal, and all of the second switching elements p2 can be controlled by a common second switching signal. Preferably the first and the second switching signal are non-overlapping, such that the first and the second switching elements do not have a closed state at the same time.

Compared to a conventional switched capacitor integrator, the single input sampling capacitor pair of such a conventional arrangement can be split into four pairs, as shown in FIG. 5. According to such splitting, the capacitance values of the sampling capacitors CS, and also of the feedback capacitors CF can be set to one quarter of that of a conventional switched capacitor integrator. Hence, there is no additional area consumption arising from the improved amplifier concept employed in a switched capacitor integrator. However, as discussed above, the transconductance performance and the input referred thermal noise voltage density is improved.

As mentioned before, the integrator of FIG. 5 employs an amplifier arrangement with four input terminal pairs, as for example depicted in FIG. 1. However, also the amplifier arrangements with six pairs or eight pairs of input terminals as described in conjunction with FIG. 3 and FIG. 4 can be employed in a switched capacitor integrator. The necessary adaptations compared to FIG. 5, namely adding additional common mode voltage sources and pairs of sampling capacitors CS and feedback capacitors CF with respective switching becomes easily apparent for the skilled person from the above description.

For example, for the implementation with six pairs of input terminals as described for FIG. 3, there is some current consumption benefit in the switched capacitor integrator, if the noise is kept constant. In particular, the current consumption reduces to ⅚ compared to the solution of FIG. 5. Additionally, the capacitor area for the same noise performance can be smaller by a factor of ⅔.

Employing the implementation with eight input terminal pairs as described in conjunction with FIG. 4 in a switched capacitor integrator, there may be no further current consumption benefit for the fourth level of stacked differential pairs if the noise is kept constant compared to the arrangement of FIG. 5. Nevertheless, the capacitor area for the same noise performance can be smaller by a factor of ½.

Theoretically, there is no maximum number of stacked differential stages, which can be inserted according to the scheme described above. However, a practical implementation may be a compromise that involves considerations about minimum acceptable transistor sizes and capacitor sizes, switching circuit complexity and associated wiring overhead, output voltage range and the amount of benefit from each additional stage. For example, the output voltage range is somewhat reduced with every stage, because every stage needs a minimum drain source voltage VDS.

Figure 6:
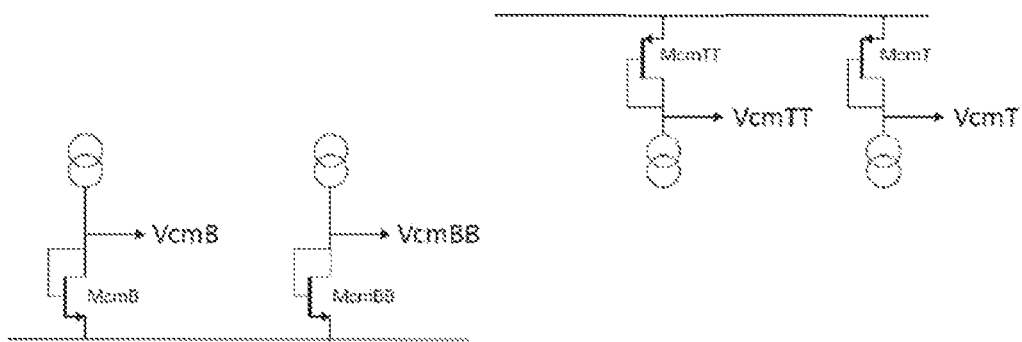
FIG. 6 shows example implementations of common mode voltage sources.

FIG. 6 shows some example implementations of common mode voltage sources that can be employed in the example implementations described above. In particular, FIG. 6 shows examples on the input common mode biasing voltages VcmB, VcmBB, VcmT and VcmTT may be generated. If the tail sources are high impedance current sources, all of the input common mode voltages for a differential stage define the drain source operating voltage of the adjacent differential stage, or of the current source in case of the common mode voltage sources VcmBB or VcmTT. These voltage sources have little influence on the amplifier's output common mode voltage. Therefore, the generation may be done by a biasing current through a MOS diode, for example as shown by diode connected transistors McmB, McmBB, McmT, McmTT. Such an arrangement is in principle a constant voltage source which tracks with differential pair threshold voltage variations, and can be scaled to achieve the desired operating points in the amplifier. Preferably, the MOS diodes are matched with the associated transistors of the differential stages to have similar PVT variations.

If the tail sources TS1, TS2 are not current sources, but are connected to a low impedance source such as the supply terminals of the arrangement directly, the input common mode voltages for the uppermost differential pair and the lowermost differential pair, namely VcmTT and VcmBB, also define the amplifier's output common mode voltage and the idle biasing current inside the amplifier. In this case the MOS diodes preferably are built to be well-matched to the differential pair to ensure a well-defined idle current. Additionally, an output common voltage regulation loop may be provided, which slightly adjusts the resulting common mode voltages VcmBB and/or VcmTT depending on the integrator output common mode voltage error. For example, the respective common mode voltage sources are adjustable according to a deviation of an actual integrator output common mode voltage from a desired integrator output common mode voltage.

The invention claimed is:

1. A switched capacitor integrator comprising:
an amplifier arrangement, comprising:
a first differential stage comprising a first and a second transistor;
a second differential stage comprising a first, a second, a third and a fourth transistor, the first and the second transistors of the second differential stage having a common source connection coupled to a drain terminal of the first transistor of the first differential stage, and the third and the fourth transistors of the second differential stage having a common source connection coupled to a drain terminal of the second transistor of the first differential stage;
a first complementary differential stage comprising a first and a second complementary transistor having opposite conductivity type compared to the transistors of the first differential stage;
a second complementary differential stage comprising a first, a second, a third and a fourth complementary transistor having opposite conductivity type compared to the transistors of the second differential stage, the first and the second complementary transistors of the second complementary differential stage having a common source connection coupled to a drain terminal of the first complementary transistor of the first complementary differential stage, and the third and the fourth complementary transistors of the second complementary differential stage having a common source connection coupled to a drain terminal of the second complementary transistor of the first complementary differential stage;

a first, a second, a third and a fourth pair of distinct input terminals; and a pair of output terminals;

a first, a second, a third and a fourth pair of sampling capacitors that are coupled to a pair of common input terminals by at least one pair of first switching elements and are coupled to the first, the second, the third and the fourth pair of input terminals, respectively, by respective pairs of second switching elements;

a first, a second, a third and a fourth pair of feedback capacitors that are coupled between the pair of output terminals and the first, the second, the third and the fourth pair of input terminals, respectively;

a first, a second, a third and a fourth common mode input for applying respective common mode voltages, the common mode inputs being coupled to the first, the second, the third and the fourth pair of sampling capacitors, respectively, by further respective pairs of first switching elements; and at least one further second switching element for connecting the sampling capacitors together, wherein the complementary transistors of the second complementary differential stage are symmetrically connected to the transistors of the second differential stage such that respective first, second, third and fourth current paths are formed, the pair of output terminals is coupled to the first and the fourth current path, gate terminals of the transistors of the first differential stage are coupled to the first pair of input terminals, gate terminals of the transistors of the second differential stage are coupled to the second pair of input terminals, gate terminals of the complementary transistors of the first complementary differential stage are coupled to the third pair of input terminals, and gate terminals of the complementary transistors of the second complementary differential stage are coupled to the fourth pair of input terminals.

2. The switched capacitor integrator according to claim 1, wherein the amplifier arrangement further comprises a biasing voltage source that is commonly connected to the second and the third current path.

3. The switched capacitor integrator according to claim 1, wherein the amplifier arrangement further comprises a first tail source and a second tail source, wherein a common source connection of the first and the second transistors of the first differential stage is coupled to the first tail source, and wherein a common source connection of the first and the second complementary transistors of the first complementary differential stage is coupled to the second tail source.

4. The switched capacitor integrator according to claim 3, wherein at least one of the first and the second tail source is implemented with a fixed current source or a controlled current source or a connection to a supply terminal.

5. The switched capacitor integrator according to claim 1, wherein the transistors of the first differential stage and the transistors of the second differential stage have the same threshold voltage, and wherein the complementary transistors of the first complementary differential stage and the complementary transistors of the second complementary differential stage have the same threshold voltage.

6. The switched capacitor integrator according to claim 1, wherein the amplifier arrangement further comprises:

a third differential stage comprising a first, a second, a third and a fourth transistor, the third differential stage being coupled between the first and the second differential stages such that the first and the second transistors of the third differential stage have a common source connection coupled to the drain terminal of the first transistor of the first differential stage, and such that the third and the fourth transistors of the third differential stage have a common source connection coupled to the drain terminal of the second transistor of the first differential stage;

a third complementary differential stage comprising a first, a second, a third and a fourth complementary transistor having opposite conductivity type compared to the transistors of the third differential stage, the third complementary differential stage being coupled between the first and the second complementary differential stages such that the first and the second complementary transistors of the third complementary differential stage have a common source connection coupled to the drain terminal of the first complementary transistor of the first complementary differential stage, and such that the third and the fourth complementary transistors of the third complementary differential stage have a common source connection coupled to the drain terminal of the second complementary transistor of the first complementary differential stage;

wherein gate terminals of the transistors of the third differential stage are coupled to a fifth pair of input terminals; and gate terminals of the complementary transistors of the third complementary differential stage are coupled to a sixth pair of input terminals.

7. The switched capacitor integrator according to claim 6, wherein the amplifier arrangement further comprises:

a fourth differential stage comprising a first, a second, a third and a fourth transistor, the fourth differential stage being coupled between the first and the third differential stages such that the first and the second transistors of the fourth differential stage have a common source connection coupled to the drain terminal of the first transistor of the first differential stage, and such that the third and the fourth transistors of the fourth differential stage have a common source connection coupled to the drain terminal of the second transistor of the first differential stage;

a fourth complementary differential stage comprising a first, a second, a third and a fourth complementary transistor having opposite conductivity type compared to the transistors of the fourth differential stage, the fourth complementary differential stage being coupled between the first and the third complementary differential stages such that the first and the second complementary transistors of the fourth complementary differential stage have having a common source connection coupled to the drain terminal of the first complementary transistor of the first complementary differential stage, and such that the third and the fourth complementary transistors have a common source connection coupled to the drain terminal of the second complementary transistor of the first complementary differential stage, wherein
gate terminals of the transistors of the fourth differential stage are coupled to a seventh pair of input terminals, and
gate terminals of the complementary transistors of the fourth complementary differential stage are coupled to an eighth pair of input terminals.

8. The switched capacitor integrator according to claim 1, wherein the amplifier arrangement further comprises a pair of common input terminals that are coupled to the first, the second, the third and the fourth pair of input terminals by respective level shifters.

9. The switched capacitor integrator according to claim 8, wherein each of the level shifters provides a distinct common mode voltage to the respective pair of input terminals.

10. The switched capacitor integrator according to claim 1, wherein all of the first switching elements are controlled by a first switching signal, all of the second switching elements are controlled by a second switching signal, and the first and the second switching signal are non-overlapping.

11. The switched capacitor integrator according to claim 1, further comprising at least one common mode voltage source connected to one of the first, the second, the third and the fourth common mode inputs.

12. The switched capacitor integrator according to claim 1, further comprising, for each of the first, the second, the third and the fourth common mode inputs, a respective common mode voltage source connected to the associated common mode input.

13. The switched capacitor integrator according to claim 11, wherein at least one of the common mode voltage sources comprises a series connection of a current source and a diode-connected transistor that is coupled to a supply terminal, an output of the common mode voltage source being formed by a connection point between the current source and the diode-connected transistor.

14. The switched capacitor integrator according to claim 11, wherein at least one of the common mode voltage sources is adjustable according to a deviation of an actual integrator output common mode voltage from a desired integrator output common mode voltage.

* * * * *